(12) United States Patent
Akahane

(10) Patent No.: US 10,700,590 B2
(45) Date of Patent: Jun. 30, 2020

(54) DRIVE DEVICE AND POWER CONVERSION DEVICE

(71) Applicant: FUJI ELECTRIC CO., LTD., Kanagawa (JP)

(72) Inventor: Masashi Akahane, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/429,066

(22) Filed: Jun. 3, 2019

(65) Prior Publication Data

US 2019/0288592 A1  Sep. 19, 2019

Related U.S. Application Data

(63) Continuation of application No. PCT/JP2018/017846, filed on May 8, 2018.

(30) Foreign Application Priority Data

Jun. 13, 2017 (JP) ................................. 2017-115782

(51) Int. Cl.
| H03K 3/00 | (2006.01) |
| H02M 1/088 | (2006.01) |
| H02M 3/158 | (2006.01) |
| H03K 17/687 | (2006.01) |
| H03K 19/0175 | (2006.01) |

(Continued)

(52) U.S. Cl.
CPC .............. *H02M 1/088* (2013.01); *H02M 1/08* (2013.01); *H02M 3/158* (2013.01); *H03K 17/06* (2013.01);
(Continued)

(58) Field of Classification Search
CPC .... H02M 1/088; H02M 3/158; H03K 17/687; H03K 19/017509; H03K 2217/0063; H03K 2217/0072
(Continued)

(56) References Cited

U.S. PATENT DOCUMENTS

| 8,106,855 B2* | 1/2012 | Choi ..................... G09G 3/2965 345/68 |
| 2008/0129372 A1* | 6/2008 | Rozsypal ................ H02M 3/07 327/536 |

(Continued)

FOREIGN PATENT DOCUMENTS

| JP | 2010035389 A | 2/2010 |
| JP | 2011066963 A | 3/2011 |

(Continued)

OTHER PUBLICATIONS

International Search Report for International Patent Application No. PCT/JP2018/017846, issued/mailed by the Japan Patent Office dated Jul. 24, 2018.

(Continued)

*Primary Examiner* — Ryan Jager

(57) ABSTRACT

A drive device includes: a gate driving unit that has gate driving circuits each driving gates of switching elements connected to each other in series; a negative-side power source that supplies a negative potential to the gate driving unit, where the negative potential steps down a reference potential that is a potential on a low side of the switching element; a negative-side capacitor for supplying a negative potential to the gate driving unit, where the negative potential steps down a reference potential that is a potential on a high side of the switching element; a timing detecting circuit that detects charging timing at which the negative-side capacitor is to be charged based on a potential state of the gate driving circuit on a high side; and a charging circuit that charges the negative-side capacitor by using the negative-side power source at the charging timing.

16 Claims, 9 Drawing Sheets

(51) Int. Cl.
  H03K 17/06 (2006.01)
  H02M 1/08 (2006.01)
  H02M 1/00 (2006.01)
  H02M 7/538 (2007.01)
(52) U.S. Cl.
  CPC ... *H03K 17/687* (2013.01); *H03K 19/017509* (2013.01); *H02M 7/538* (2013.01); *H02M 2001/0006* (2013.01); *H03K 2217/0063* (2013.01); *H03K 2217/0072* (2013.01)
(58) Field of Classification Search
  USPC ........................................................ 327/109
  See application file for complete search history.

(56) References Cited

U.S. PATENT DOCUMENTS

| | | | | |
|---|---|---|---|---|
| 2010/0123511 | A1* | 5/2010 | Strzalkowski | H03K 17/6871 327/530 |
| 2014/0375292 | A1* | 12/2014 | Kihara | H02M 1/08 323/283 |
| 2016/0079967 | A1 | 3/2016 | Miwa | |
| 2016/0087623 | A1* | 3/2016 | Yamaguchi | H03K 17/163 327/109 |
| 2017/0288528 | A1* | 10/2017 | McCoy | H02M 1/36 |
| 2017/0288552 | A1* | 10/2017 | Hari | H02M 3/33507 |

FOREIGN PATENT DOCUMENTS

| | | |
|---|---|---|
| JP | 2013158139 A | 8/2013 |
| JP | 2013179821 A | 9/2013 |
| JP | 2016058956 A | 4/2016 |

OTHER PUBLICATIONS (ISA/237) Written Opinion of the International Search Authority for International Application No. PCT/JP2018/017846, issued/mailed by the International Bureau of WIPO dated Jul. 24, 2018.

* cited by examiner

DRIVE DEVICE AND POWER CONVERSION DEVICE

The contents of the following Japanese patent application are incorporated herein by reference:
No. 2017-115782 filed in JP on Jun. 13, 2017; and
PCT/JP2018/017846 filed on May 8, 2018

BACKGROUND

1. Technical Field

The present invention relates to a drive device and a power conversion device.

2. Related Art

A power conversion device (also referred to as an inverter) includes, for example, two switching elements respectively provided on a high side and a low side, and two gate driving circuits respectively driving gates of the two switching elements. Here, in order to switch off the switching elements at high speed, a negative voltage may be input to the gates. For that reason, in each gate driving circuit, two floated driving power sources are required as driving power sources to respectively supply a positive voltage and a negative voltage input to the gates for turning on and turning off the switching elements (also referred to as a positive-side power source and a negative-side power source).

Here, for example, Patent Documents 1 to 3 have disclosed a technology to provide, in a power conversion device having a half-bridge structure, a bootstrap circuit that supplies a power source voltage to the gate driving circuit on the high side from the low side by using a capacitor so that a simple structure having no active voltage source on the high side is obtained.

[Patent Document 1] Japanese Patent Application Publication No. 2010-35389
[Patent Document 2] Japanese Patent Application Publication No. 2011-66963
[Patent Document 3] Japanese Patent Application Publication No. 2013-179821

However, the bootstrap circuit described in the Patent Document 1 includes positive-side and negative-side power sources on a low side, and needs two capacitors (also referred to as a positive-side and negative-side capacitors respectively) for the positive-side power source and the negative-side power source and an additional driving power source for charging the negative-side capacitor on a high side. Also, the bootstrap circuit described in Patent Document 2 includes positive-side and negative-side power sources on a low side and includes positive-side and negative-side capacitors on a high side, where a switching element on the high side is turned off and a switching element on the low side is turned on, and the negative-side power source is connected to the negative-side capacitor by an additional switching element at the same time to charge the negative-side capacitor. However, timing for charging the negative-side capacitor cannot be controlled. Also, the bootstrap circuit described in Patent Document 3 includes positive-side and negative-side power sources on a low side, and positive-side and negative-side capacitors and an additional switching element on a high side, where when a switching element on the low side is turned on, a positive-side capacitor is charged and the additional switching element is turned on to use the negative-side capacitor as a negative-side power source, and when a switching element on the high side is turned on, the additional switching element is turned off and the positive-side capacitor is used to charge the negative-side capacitor. However, a potential of the positive-side capacitor greatly varies and propagation delay time and the like may be affected.

SUMMARY (Item 1)
A drive device that drives a switching circuit having a first switching element and a second switching element that are connected to each other in series may be provided. The drive device may include a gate driving unit that has a first gate driving circuit the drives a gate of the first switching element, and a second gate driving circuit that drives a gate of the second switching element. The drive device may include a negative-side power source that supplies a first negative potential to the gate driving unit, where a first reference potential that is a potential on a low side of the first switching element is a positive-side potential of the negative-side power source and the first negative potential is a negative-side potential of the negative-side power source. The drive device may include a negative-side capacitor for supplying a second negative potential to the gate driving unit, where a second reference potential that is a potential on a high side of the first switching element is a positive-side potential of the negative-side capacitor and the second negative potential is a negative-side potential of the negative-side capacitor. The drive device may include a timing detecting circuit that detects, based on a potential state of the driving circuit on the high side that is one of the first gate driving circuit and the second gate driving circuit, charging timing at which the negative-side capacitor is to be charged. The drive device may include a charging circuit that charges the negative-side capacitor by using the negative-side power source at the charging timing.

(Item 2)
The drive device may include a positive-side power source that supplies a first positive potential to the gate driving unit, where the first reference potential is a negative-side potential of the positive-side power source and the first positive potential is a positive-side potential of the positive-side power source. The drive device may include a positive-side capacitor for supplying a second positive potential to the gate driving unit, where the second reference potential is a negative-side potential of the positive-side capacitor and the second positive potential is a positive-side potential of the positive-side capacitor. The drive device may include a first rectifier that passes current therethrough, the current being from a positive-side terminal of the positive-side power source toward the positive-side capacitor, and blocks current in an opposite direction.

(Item 3)
The timing detecting circuit may detect the charging timing based on at least one of the first positive potential, the second positive potential, the first reference potential, the second reference potential, the first negative potential and the second negative potential.

(Item 4)
The timing detecting circuit may detect the charging timing under a condition that a difference between the second reference potential and the first negative potential is equal to or lower than a reference voltage.

(Item 5)
The timing detecting circuit may detect the charging timing under a condition that a divided voltage obtained by dividing the second reference potential and the first negative potential is equal to or lower than a first threshold.

(Item 6)

The timing detecting circuit may clamp the divided voltage to a voltage equal to or lower than a second threshold that is higher than the first threshold.

(Item 7)

The timing detecting circuit may detect the charging timing under a condition that the current flowing from the positive-side power source to the positive-side capacitor is equal to or greater than a third threshold.

(Item 8)

The timing detecting circuit may detect the charging timing under a further condition that a first gate control signal is received, where the first gate control signal instructs the first gate driving circuit to turn the first switching element on.

(Item 9) The charging circuit may have a third switching element that connects the first negative potential and the second negative potential at the charging timing.

(Item 10)

The drive device may further include a second rectifier that passes current therethrough, the current being from the first reference potential toward the second reference potential, and blocks current in the opposite direction.

(Item 11)

The first switching element may be a switching element on the low side of the switching circuit. The second switching element may be a switching element on the high side of the switching circuit.

(Item 12)

The first gate driving circuit may receive the first positive potential and the first negative potential as a driving voltage. The second gate driving circuit may receive the second positive potential and the second negative potential as a driving voltage.

(Item 13)

The drive device may further include a level shifting circuit that shifts a level of a first gate control signal for controlling the gate of the second switching element using the first reference potential as a reference to generate a second converted gate control signal using the second reference potential as a reference. The second gate driving circuit may drive the gate of the second switching element according to the second converted gate control signal.

(Item 14)

The level shifting circuit may have a level shifting resistor and a level-shifting switching element that are connected to each other in series in this sequence between the second positive potential and the second negative potential. The level shifting circuit may have a level shifting rectifier that passes current therethrough, the current being from the second reference potential toward a connection point between the level shifting resistor and the level-shifting switching element, and blocks current in the opposite direction.

(Item 15)

The negative-side capacitor may have smaller capacitance than that of the positive-side capacitor.

(Item 16)

The power conversion device may include the drive device according to any one of Items 1 to 15. The power conversion device may include the first switching element and the second switching element.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1:
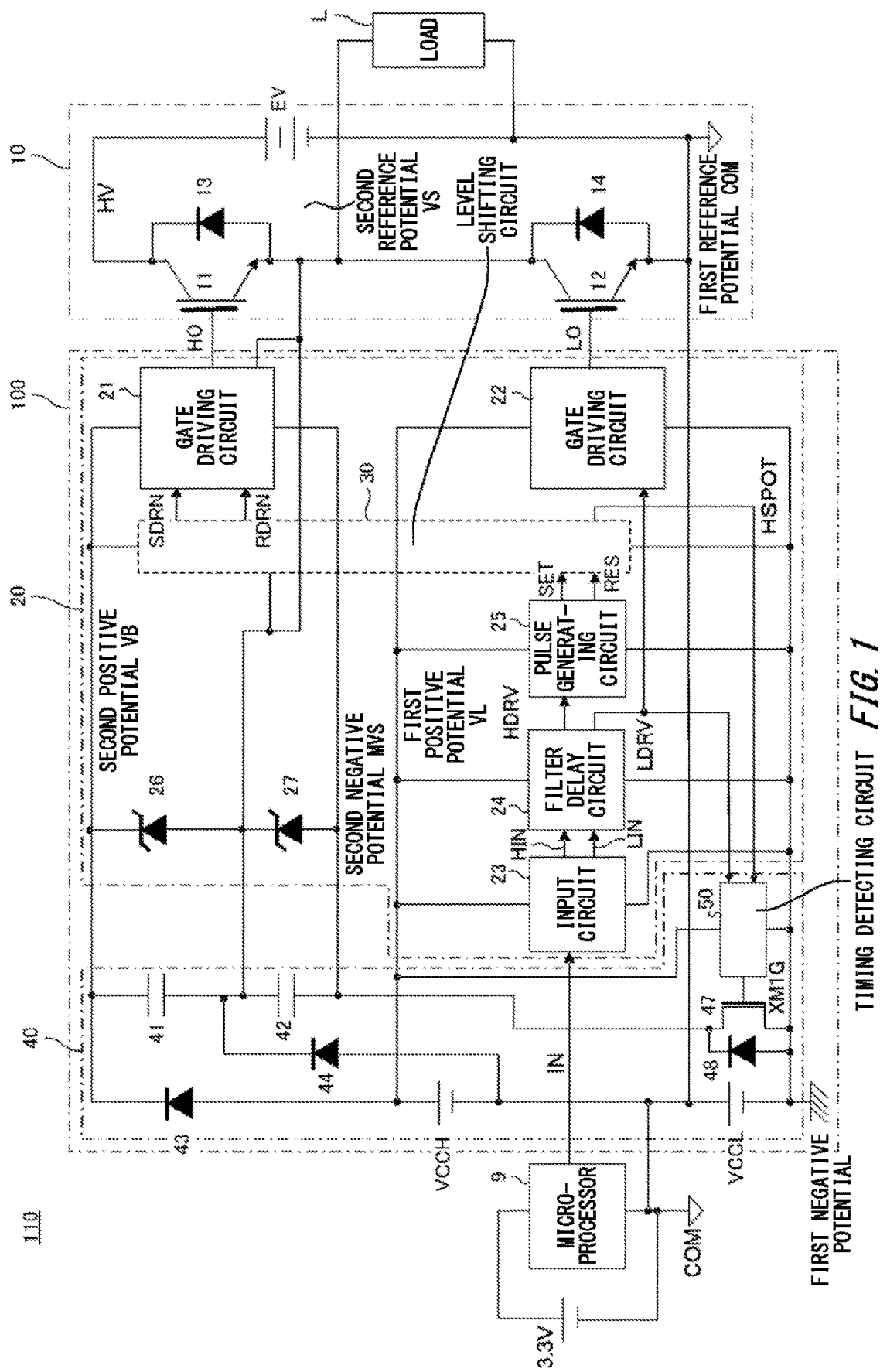
FIG. 1 shows a structure of a drive device according to the present embodiment and a power conversion device including the drive device.

FIG. 1 shows a structure of a drive device 100 according to the present embodiment and a power conversion device 110 including the drive device 100. The drive device 100 enables a switching element to be driven by a negative-side power source by controlling timing for charging a capacitor for a driving power source provided on a high side in the power conversion device 110, without providing an active driving power source on the high side. The power conversion device 110 includes a switching circuit 10 and a drive device 100.

The switching circuit 10 has switching elements 11, 12 and rectifying elements 13, 14, which constitute a half-bridge type switching circuit for a load L and a power source EV. Note that a positive electrode side and a negative electrode side of the power source EV are respectively referred to as a high side (HS) and a low side (LS).

The switching elements 11, 12 are Insulated Gate Bipolar Transistor (IGBT), as one example. Note that as the switching elements 11, 12, a Metal Oxide Semiconductor Field Effect Transistor (MOSFET) may also be adopted. The switching elements 11, 12 have a gate electrode (also simply referred to as a gate), a collector electrode (also simply referred to as a collector) and an emitter electrode (also simply referred to as an emitter). The switching elements 11, 12 are connected to each other in series by connecting the emitter of the switching element 11 and the collector of the switching element 12, are provided on the high side and the low side.

The rectifying elements 13, 14 are Free Wheel Diode (FWD), as one example. The rectifying elements 13, 14 are respectively connected to the switching elements 11, 12 in reverse parallel. Note that in a case where the switching elements 11, 12 include a parasitic diode, the rectifying elements 13, 14 may not be provided.

In the switching circuit 10, the collector and the emitter of the switching element 11 are respectively connected to a positive electrode of the power source EV and one end of the load L, and the collector and the emitter of the switching element 12 are respectively connected to one end of the load L and a negative electrode of the power source EV. However, the other end of the load L is connected to the negative electrode of the power source EV. Here, potentials on the high side and the low side of the switching element 12 (that is, the potentials of one end and the other end of the load L) are represented as reference potentials VS, COM (respectively, one example of the second and first reference potentials) that are references of respective operations.

The drive device 100 is a device that drives the switching circuit 10 in accordance with a control signal IN input from outside. The drive device 100 has a gate driving unit 20 and a bootstrap circuit 40.

The gate driving unit 20 is a unit that drives the gates of the switching elements 11, 12 and drives the switching circuit 10, and includes an input circuit 23, a filter delay circuit 24, a pulse generating circuit 25, and a level shifting circuit 30, gate driving circuits 21, 22 and Zener diodes 26, 27. Note that as one example, a control signal IN is generated for a reference potential COM by a microprocessor 9 provided outside the drive device 100 and is input to the gate driving unit 20.

The input circuit 23 generates gate control signals HIN, LIN for controlling the gates of the switching elements 11, 12 in accordance with the control signal IN. The gate control signals HIN, LIN are input to the filter delay circuit 24 in a later stage.

The filter delay circuit 24 eliminates noise from the gate control signals HIN, LIN and delays one of the gate control signals HIN, LIN relative to the other thereof to output HDRV and LDRV signals. For example, by delaying rising of the gate control signal LIN relative to falling of the gate control signal HIN and by delaying rising of the gate control signal HIN relative to falling of the gate control signal LIN, the switching elements 11, 12 are prevented from being turned on at the same time.

The pulse generating circuit 25 generates control signals SET, RES that are input from the gate control signal HDRV to the level shifting circuit 30. Here, the control signals SET, RES respectively include a pulse signal that is generated according to rising and falling of the gate control signal HDRV.

The level shifting circuit 30 generates converted gate control signals SDRN, RDRN for controlling the gate of the switching element 11. The converted gate control signals SDRN, RDRN are generated by shifting a level of the gate control signal HDRV (a control signals SET, RES that is to be generated therefrom) using the negative potential GND as a reference and converting the signal using the negative potential MVS as a reference. The structure of the level shifting circuit 30 is described below.

The gate driving circuits 21, 22 are respectively provided on the high side and the low side to drive the gates of the switching elements 11, 12.

Figure 2:
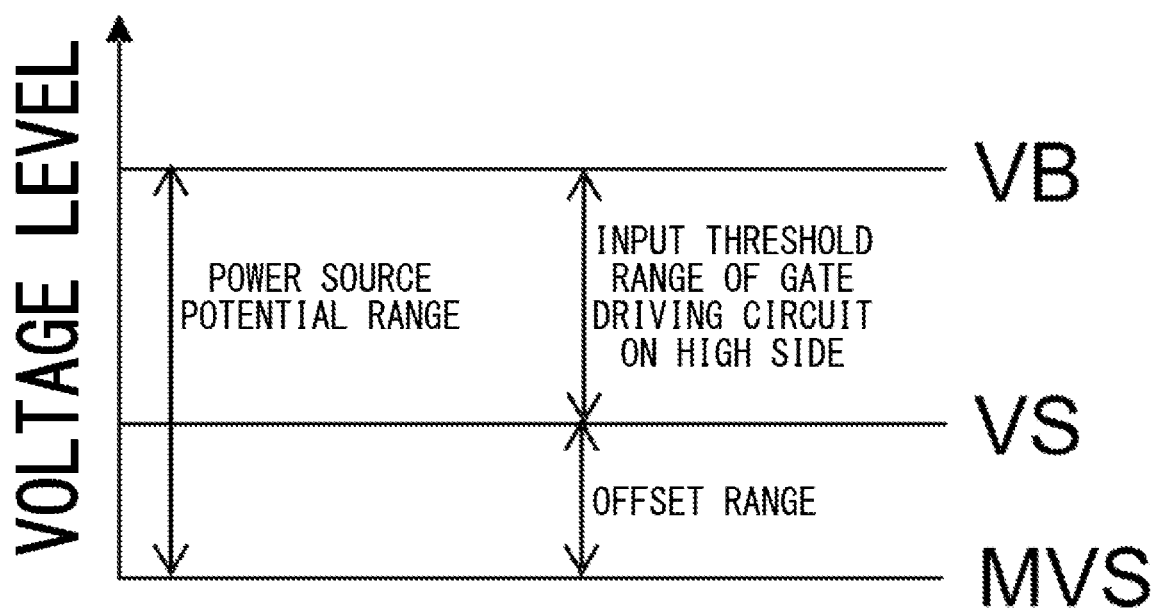
FIG. 2 shows an input threshold range of a gate driving circuit on a high side.

The gate driving circuit 21 generates gate driving signals HO in accordance with the converted gate control signals SDRN, RDRN generated by the level shifting circuit 30 and inputs the gate driving signal HO to the gate of the switching element 11. Here, the gate driving signals HO are switched between a positive voltage signal and a negative voltage signal for turning the switching element 11 on and off, and the gate driving signals HO are generated by the gate driving circuit 21 by utilizing a positive potential VB (one example of the second positive potential) and a negative potential MVS (one example of the second negative potential) that are received, as a driving voltage, respectively from the positive-side and negative-side capacitors 41, 42. As shown in the input threshold range of the gate driving circuit 21 of FIG. 2, the negative potential MVS has a potential dropped from the reference potential VS by an offset voltage corresponding to a charging voltage (VS-MVS) of a negative-side capacitor 42, and a voltage range of the gate control signal HO is given between the positive potential VB and the negative potential MVS.

Figure 3:
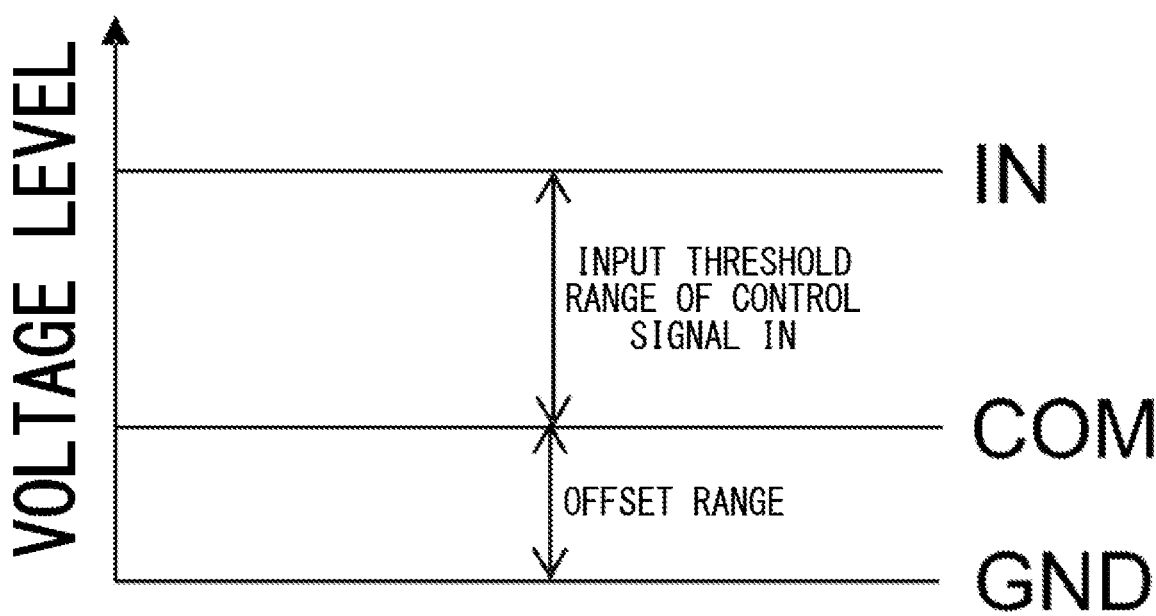
FIG. 3 shows an input threshold range of an input circuit.

In the gate driving circuit 22, gate driving signals LO are generated in accordance with the control signal LDRV generated by the filter delay circuit 24 through the control signal LIN generated by the input circuit 23, and are input to the gate of the switching element 12. Here, the gate driving signals LO are switched between a positive voltage signal and a negative voltage signal for turning the switching element 12 on and off, and the gate driving signals LO are generated by the gate driving circuit 22 by utilizing a positive potential VL (one example of the first positive potential) and a negative potential GND (one example of the first negative potential) that are received, as the driving voltage, respectively from the positive side and negative-side power sources VCCH, VCCL. As shown in the input threshold range of the input circuit 23 of FIG. 3, the negative potential GND has a potential dropped from the reference potential COM by an offset voltage corresponding to a power source voltage (COM-GND) of the negative-side power source VCCL, and a voltage range of the control signal IN is given between the positive potential VL and the reference potential COM; however, a voltage range of the gate control signal LDRV is given between the positive potential VL and the negative potential GND.

The Zener diodes 26, 27 respectively maintains the positive potential VB and the negative potential MVS at a certain potential difference or less relative to the reference potential VS by breakdown voltages thereof. Accordingly, even if the positive-side and negative-side capacitors 41, 42 are overcharged, certain positive voltage and negative voltage can be supplied to the gate driving circuit 21.

The bootstrap circuit 40 is a circuit that supplies a power source voltage to the gate driving circuit 21 provided on the high side from the power source provided on the low side. The bootstrap circuit 40 includes the positive-side and negative-side power sources VCCH, VCCL, the positive-side and negative-side capacitors 41, 42, the rectifiers 43, 44, the switching elements 47, the rectifying element 48 and the timing detecting circuit 50.

The positive-side negative-side power sources VCCH, VCCL are power sources that are provided on the low side, are used for generating the gate driving signal LO input to the gate of the switching element 12, and supply the positive potential VL and the negative potential GND to the gate driving circuit 22 of the within the gate driving unit 20. Note that the positive-side and negative-side power sources VCCH, VCCL may be also generated by AC-DC conversion and the like from an external power source (for example, a commercial power source), and may also be generated by using a local power source, a battery or the like. The positive-side and negative-side power sources VCCH, VCCL are respectively connected in series, connection points thereof are connected to reference potential COM and the negative electrode of the negative-side power source VCCL is connected to negative potential GND. The positive-side power source VCCH generates a positive potential VL and supplies the positive potential VL to the gate driving circuit 22. The negative-side power source VCCL generates the negative potential GND and supplies the negative potential GND to the gate driving circuit 22. Accordingly, the gate driving signals LO of the positive potential VL and the negative potential GND relative to the reference potential COM can be generated.

The positive-side and negative-side capacitor 41, 42 are elements that are provided on the high side, are used for generating the gate driving signal HO input to the gate of the switching element 11, and supply the positive potential VB and the negative potential MVS to the gate driving circuit 21 within the gate driving unit 20. The positive-side and negative-side capacitors 41, 42 are respectively connected in series and connection points thereof are connected to the reference potential VS. The positive-side capacitor 41 is charged by the positive-side power source VCCH, generates the positive potential VB and supplies the positive potential VB to the gate driving circuit 21. While the positive-side capacitor is charged, the negative-side capacitor 42 is charged by the negative-side power source VCCL, generates the negative potential MVS and supplies the negative potential MVS to the gate driving circuit 21. Accordingly, the gate driving signals HO of the positive potential VB and the negative potential MVS relative to the reference potential VS can be generated. Note that the negative-side capacitor 42 may have smaller capacitance than that of the positive-side capacitor 41.

The rectifiers 43, 44 are elements that respectively charge the positive-side and negative-side capacitors 41, 42 by causing current flowing therethrough from the positive-side and negative-side power sources VCCH, VCCL, and supply the positive potential VB and the negative potential MVS to the gate driving circuit 21 without returning the current back to the positive-side and negative-side capacitors 41, 42. The rectifier 43 is connected between the positive-side power source VCCH and the positive-side capacitor 41, passes current therethrough, the current being from the positive electrode of the positive-side power source VCCH toward the positive-side capacitor 41, and blocks current in the opposite direction. Accordingly, when the switching element 12 is turned on, a charging circuit is formed by the positive-side power source VCCH, the rectifier 43, the positive-side capacitor 41 and the switching element 12, and the positive-side capacitor 41 is charged by the positive-side power source VCCH. The rectifier 44 is connected between the reference potential COM and the reference potential VS, passes current that is from the reference potential COM toward the reference potential VS therethrough, and blocks current in the opposite direction.

Note that in a case where reduction of a combined capacitance value of serial capacitors of the positive-side and negative-side capacitors 41, 42 is allowed, the rectifier 44 does not necessarily need to be provided. In this case, when a switching element 47 described below is turned on, the charging circuit is formed by the positive-side and negative-side power sources VCCH, VCCL, the rectifier 43, the positive-side and negative-side capacitors 41, 42 and the switching element 47 in series, and the negative-side capacitor 42 is charged along with the positive-side capacitor 41 by the positive-side and negative-side power sources VCCH, VCCL in series.

The switching element 47 is controlled by a timing detecting circuit 50 described below and is turned on at the charging timing to connect the negative potentials GND, MVS. Accordingly, the charging circuit is formed by the negative-side power source VCCL, the rectifier 44, the negative-side capacitor 42 and the switching element 47 and the negative-side capacitor 42 is charged by the negative-side power source VCCL.

The rectifying element 48 is connected to the switching element 47 in reverse parallel. By the rectifying element 48, the negative potential MVS is set so as to be greater than the negative potential GND. Note that in a case where the switching element 47 includes a parasitic diode, the rectifying element 48 may not be provided.

The timing detecting circuit 50 is a circuit that detects the charging timing for charging the negative-side capacitor 42 based on a potential state of the gate driving circuit 21 provided on the high side. The timing detecting circuit 50 detects the charging timing by utilizing, as control inputs, the gate control signal LDRV on the low side and a below-described potential level output HSPOT on the high side (corresponding to the difference between the reference potential VS and the negative potential GND), turns the switching element 47 on at the timing and forms the charging circuit to charge the negative-side capacitor 42. The structure of the timing detecting circuit 50 is described below.

Figure 4:
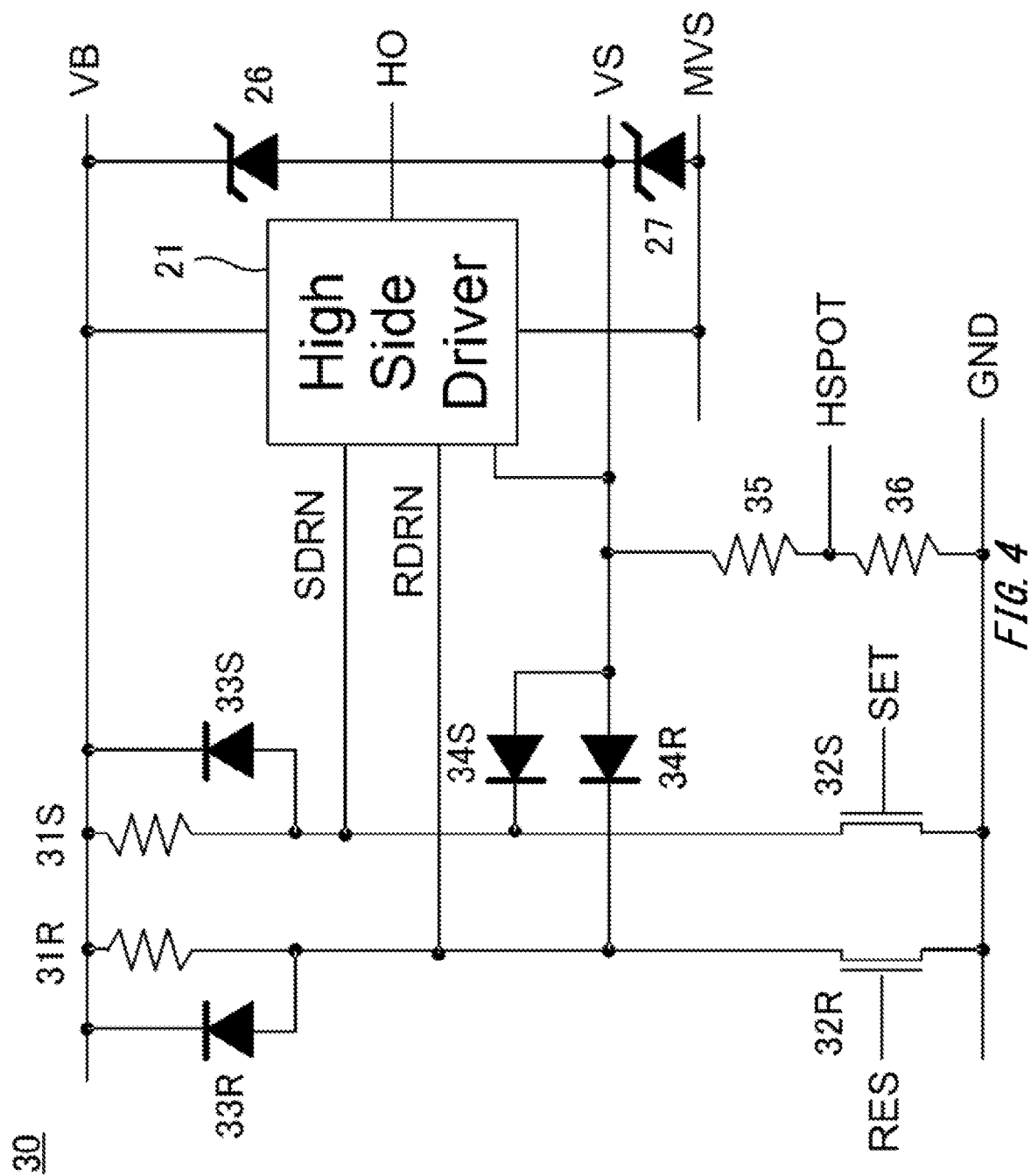
FIG. 4 shows a structure of a level shifting circuit along with the gate driving circuit on the high side and a Zener diode.

FIG. 4 shows the structure of the level shifting circuit 30 along with the gate driving circuit 21 on the high side and the Zener diodes 26, 27. The level shifting circuit 30 has resistance elements 31S, 31R, switching elements 32S, 32R, rectifying elements 33S, 33R, rectifying elements 34S, 34R and resistance elements 35, 36.

The resistance elements 31S, 31R are one example of a level shifting resistor, and each has one end connected to a positive electrode (that is, the positive potential VB) of the positive-side capacitor 41 and the other end connected to the gate driving circuit 21.

The switching elements 32S, 32R are one example of a level-shifting switching element, and are respectively connected between the other ends of the resistance elements 31S, 31R and the negative potential GND. The switching element 32S is driven by a control signal SET output from the pulse generating circuit 25 and input to the gate driving circuit 21 as a converted gate control signal SDRN. The switching element 32R is driven by a control signal RES output from the pulse generating circuit 25 and input to the gate driving circuit 21 as a converted gate control signal RDRN.

The rectifying elements 33S, 33R have cathodes toward the positive potential VB side and are respectively connected to the resistance elements 31S, 31R in parallel so that the converted gate control signals SDRN, RDRN do not exceed the positive potential VB.

The rectifying elements 34S, 34R have anodes toward the reference potential VS side and are respectively connected between the resistance elements 31S, 31R and the connection point between the switching elements 32S, 32R and the reference potential VS such that the converted gate control signals SDRN, RDRN do not exceed the reference potential VS.

Accordingly, the level shifting circuit 30 inputs the control signals SET, RES respectively generated according to rising and falling of the gate control signal HDRV, and the control signals SET, RES are respectively converted into converted gate control signals SDRN, RDRN having potentials between the positive potential VB and the reference potential VS.

The resistance elements 35, 36 are connected in series between the reference potential VS and the negative potential GND. Further, the potential of the connection point between the resistance elements 35, 36 is input to the timing detecting circuit 50 as the potential level output HSPOT on the high side. Note that resistance values of the resistance elements 35, 36 are defined so as to be higher than and so as to be lower than a below-described reference VREF within the timing detecting circuit 50 when the switching element 11 is turned on and when the switching element 11 is turned off (that is, when the high side is in a high potential state and when the high side is in a low potential state).

Figure 5:
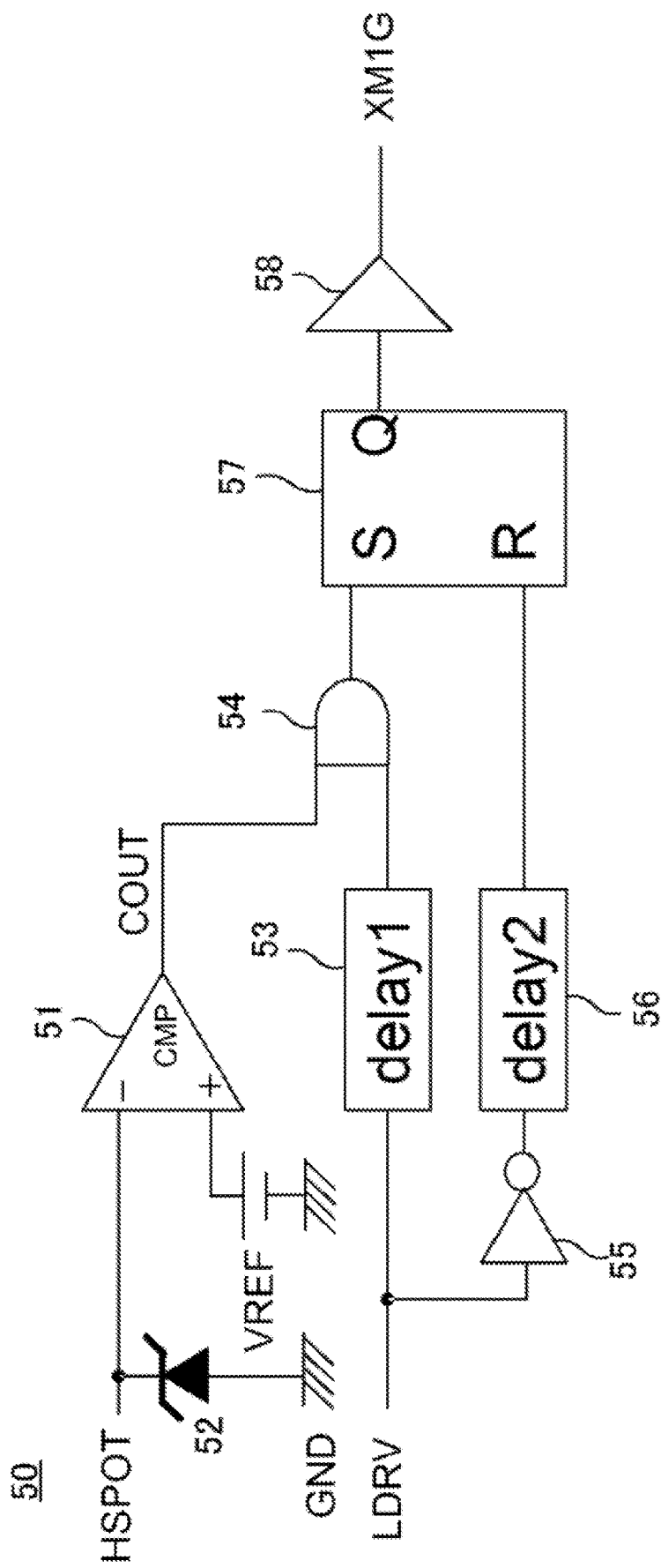
FIG. 5 shows a structure of a timing detecting circuit.

FIG. 5 shows the structure of the timing detecting circuit 50. The timing detecting circuit 50 has a comparator 51, a Zener diode 52, a delay circuit 53, a logical product (AND) circuit 54, a logical negation (NOT) circuit 55, a delay circuit 56, a latch circuit 57 and an amplifier 58.

The comparator 51 compares a potential level output HSPOT on the high side output from the level shifting circuit 30 to the reference VREF, and if the potential level output HSPOT is equal to or lower than the reference VREF and if the potential level output HSPOT is higher than the reference VREF, respectively outputs a high-level and a low-level comparison result COUT. Accordingly, under a condition that a difference between the reference potential VS and the negative potential GND is equal to or lower than a reference voltage corresponding to the reference VREF, the charging timing can be detected.

The Zener diode 52 clamps the potential level output HSPOT on the high side input to the comparator 51 to a breakdown voltage thereof or less. Here, the breakdown voltage is larger than the reference VREF. Because the potential level output HSPOT greatly increases and decreases according to the switched state of the switching element 11, an excessively high voltage signal accordingly can be prevented from being input to the comparator 51.

The delay circuit 53 outputs a pulse wave delayed relative to the rising of the gate control signal LDRV. By arbitrarily defining delay time delay1, the beginning of the charging timing can be delayed to the rising of the gate control signal LDRV, that is, the turning the switching element 12 on to detect.

The AND circuit 54 calculates AND of the comparison result COUT of the comparator 51 and an output of the delay circuit 53 and outputs a result. Accordingly, a case where the comparison result COUT of the comparator 51 is high-level, that is, a case where the switching element 11 is turned off and the gate driving circuit 21 provided on the high side is in the low potential state can be detected.

The NOT circuit 55 calculates NOT of the gate control signal LDRV and outputs a result.

The delay circuit 56 outputs a pulse wave delayed relative to the rising of the logical negation of the gate control signal LDRV, that is, the falling of the gate control signal LDRV. By arbitrarily defining the delay time delay 2, the ending of the charging timing can be delayed to the falling of the gate control signal LDRV, that is, the turning the switching element 12 off to detect.

The latch circuit 57 is set by an output of the AND circuit 54 and reset by an output of the delay circuit 56. Accordingly, when the switching element 11 is turned off and the gate driving circuit 21 provided on the high side is in the low potential state, the beginning of the charging is delayed to the turning on of the switching element 12 and the ending of the charging is delayed to the turning off of the switching element 12, and the charging timing signal is generated.

The amplifier 58 amplifies and outputs an output of the latch circuit 57. The output is input to the gate of the switching element 47 as a gate driving signal XM1G.

Figure 6:
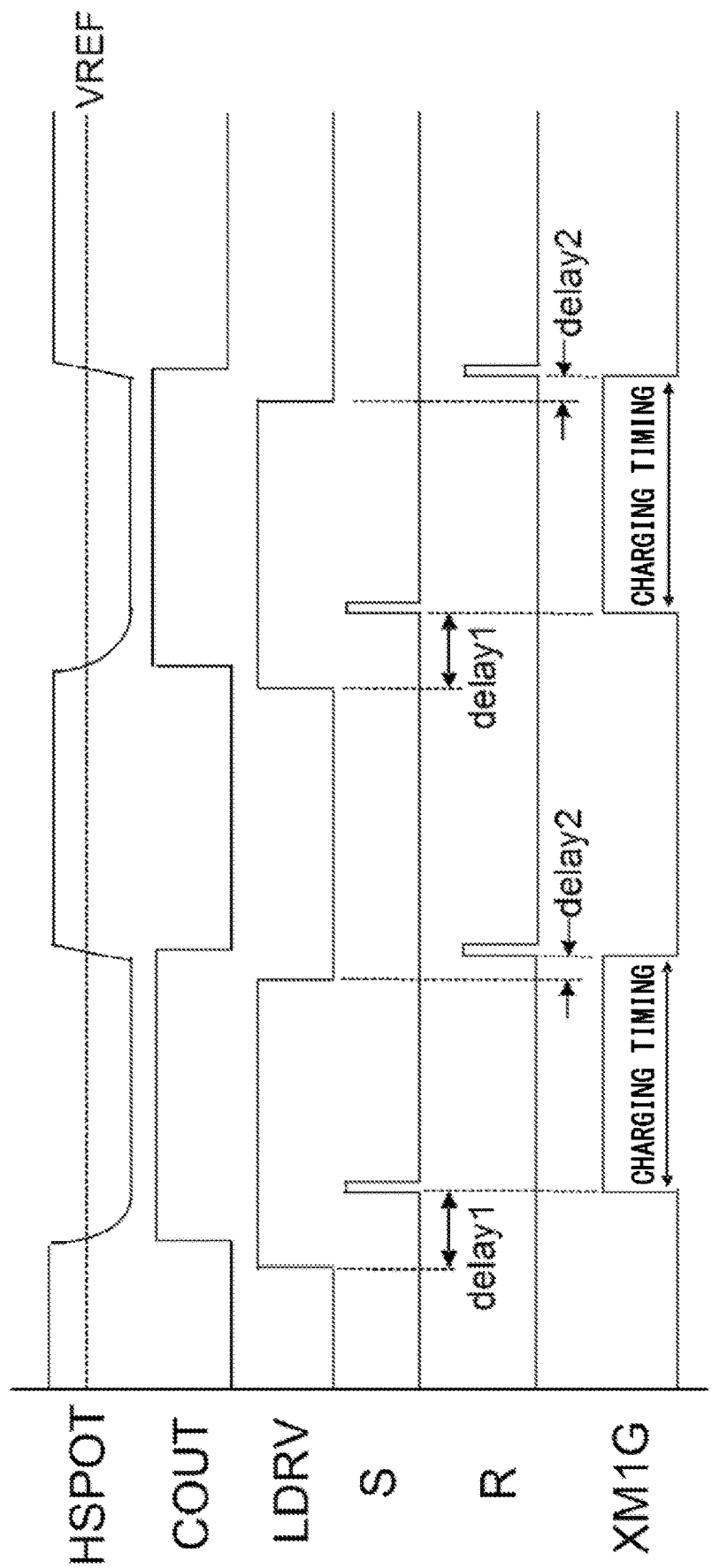
FIG. 6 shows one example of an operating waveform of the timing detecting circuit.

FIG. 6 shows one example of an operating waveform of the timing detecting circuit 50. The top row shows a waveform of the potential level output HSPOT. The potential level output HSPOT indicates the potential state of the gate driving circuit 21 provided on the high side and is repeated in high level and low level in association with the switched operations (turned-on and turn-off) of the switching element 11. The second row shows a waveform of the output COUT of the comparator 51. When the potential level output HSPOT is equal to or lower than the reference VREF and when the potential level output HSPOT is higher than the reference VREF, the output COUT is respectively in high level and in low level. The third row shows a waveform of the gate control signal LDRV on the low side. Contrary to the gate control signal HDRV on the high side (not shown in the drawings), the gate control signal LDRV is, repeated in high level and low level. The fourth and fifth rows respectively show a waveform of an output S of the AND circuit 54 and a waveform of an output R of the delay circuit 56. When the output COUT of the comparator 51 is in high level, that is, when the switching element 11 is turned off and the gate driving circuit 21 provided on the high side is in the low potential state, the output S is delayed to the rising of the gate control signal LDRV (corresponding to the turning on of the switching element 12) and rises in a pulsed way. The output R is delayed relative to the falling of the gate control signal LDRV (corresponding to the turning off of the switching element 12) and rises in a pulsed way. The sixth row shows a waveform of the gate driving signal XM1G The gate driving signal XM1G rises according to the rising of the output S and falls according to the rising of the output R. Accordingly, when the switching element 11 is turned off and the gate driving circuit 21 provided on the high side is in the low potential state, the beginning of the charging timing of the negative-side capacitor 42 is delayed to the turning on of the switching element 12, and the ending of the charging timing of the negative-side capacitor 42 is delayed to the turning off of the switching element 12. Note that by determining delay times delay1, delay2 by the delay circuits 53, 56, the charging timing can be arbitrarily determined according to the turning-on operation of the switching element 11.

Figure 7:
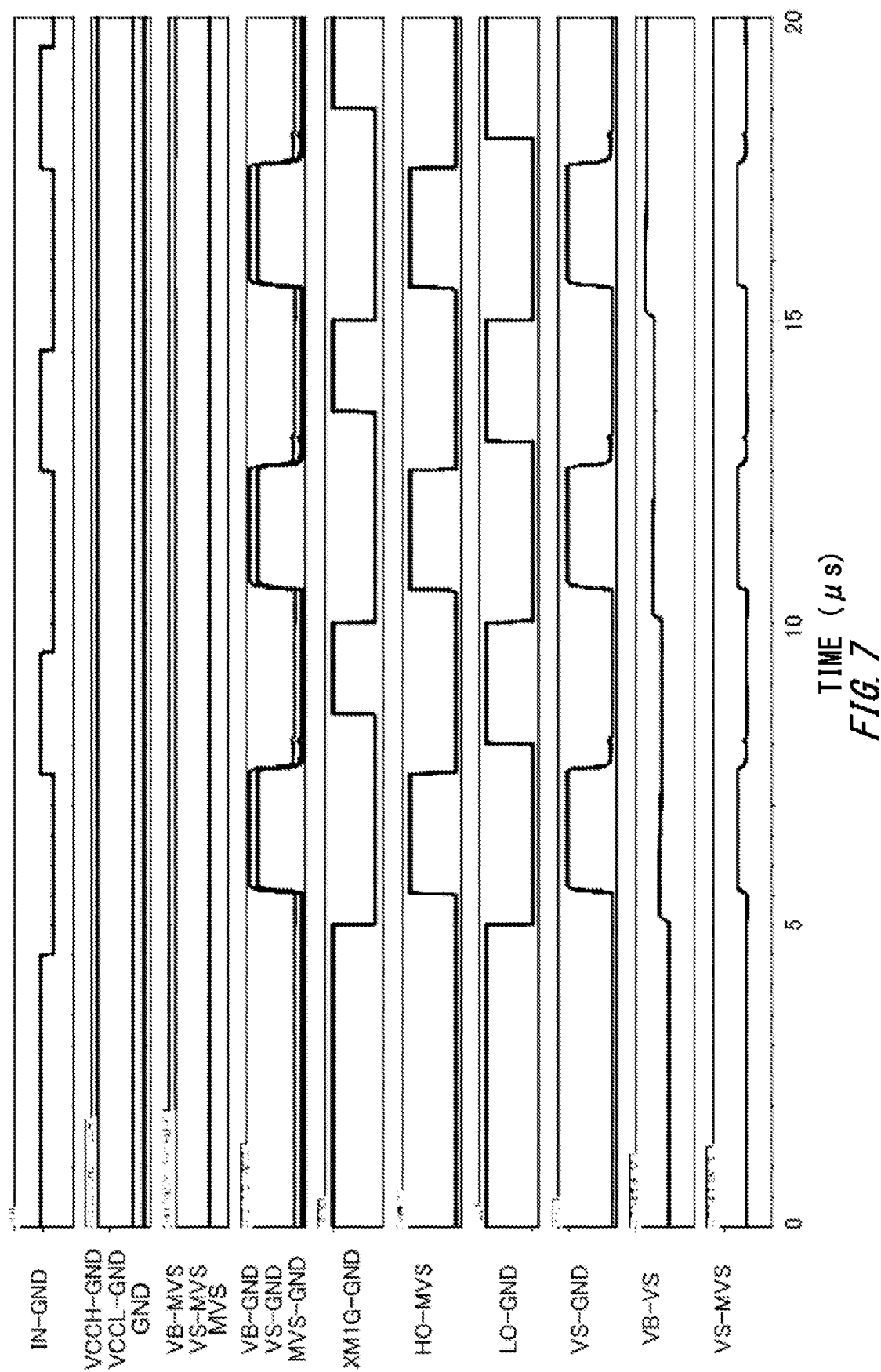
FIG. 7 shows one example of an operating waveform in the drive device and the power conversion device.

FIG. 7 shows one example of operating waveforms in the drive device 100 and the power conversion device 110. The top row shows a waveform of the control signal IN. The control signal IN is repeated in low level for 3 µs from a time point of 5 µs and in high level for 2 µs, with an amplitude 3.3 V using the negative potential GND as a reference. The second row shows waveforms of output voltages of the positive-side power source VCCH and the negative-side power source VCCL. The output voltages of the positive-side power source VCCH and the negative-side power source VCCL are respectively 20 V and 5 V using the negative potential GND as a reference. The third row shows waveforms of the positive potential VB and the reference potential VS using the negative potential MVS as a reference. The positive potential VB and the reference potential VS are respectively 20 V and 5 V using the negative potential MVS as the reference. The fourth row shows waveforms of the positive potential VB, the reference potential VS and the negative potential MVS using the negative potential GND as the reference. The positive potential VB, the reference potential VS and the negative potential MVS fluctuate, with amplitude of 120 V, in association with the switched operations (turned-on and turned-off) of the switching element 11. The fifth row shows a waveform of the gate driving signal XM1G The gate driving signal XM1G has an amplitude of 5 V using the negative potential GND as the reference, and when the high side (the reference potential VS) is in the low potential state, the gate driving signal XM1G is delayed to the gate control signal LDRV on the low side (in the present example, corresponding to the high level of the control signal IN) and becomes in high level. The sixth and seventh rows respectively show waveforms of the gate driving signals HO, LO. The gate driving signals HO, LO have an amplitude of 20 V respectively using the negative potential MVS and the negative potential GND as the references, and are alternately repeated in high level of different reference potentials through a low-level period of reference potentials different from each other. The eighth row shows a waveform of the reference potential VS on the high side. The ninth and tenth rows respectively show a potential variation waveform of the positive potential VB relative to the reference potential VS, and a potential variation waveform of the reference potential VS relative to the negative potential MVS. Both the potentials fluctuate within a variation range of 50 mV or less and the charging and discharging are repeated.

Note that although the drive device 100 according to the present embodiment utilizes, as the potential state of the high side on which the timing detecting circuit 50 detects the charging timing (detects as the potential level output HSPOT), the potential difference between the reference potential VS and the negative potential GND, the drive device 100 may utilize at least one of the positive potentials VB, VL, the reference potentials VS, COM and the negative potentials MVS, GND. Particularly, a potential difference between at least one of the positive potential VB, the reference potential VS and the negative potential MVS, and at least one of the positive potential VL, the reference potential COM and the negative potential GND may be utilized. Also, a potential difference between at least one of the positive potential VB, the reference potential VS and the negative potential MVS, and the negative potential GND may be utilized.

Figure 8:
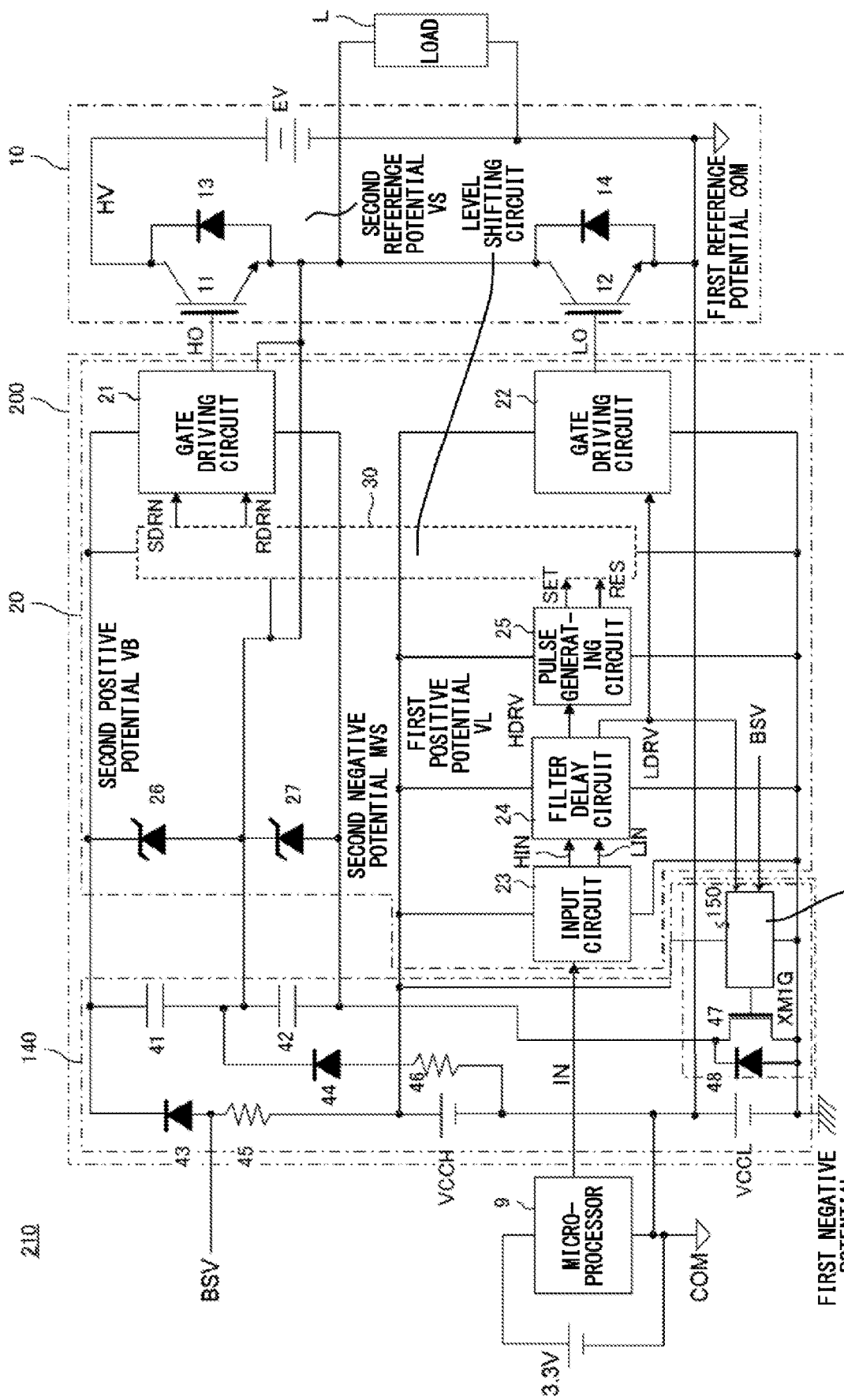
FIG. 8 shows a structure of a drive device according to a modified example and a power conversion device including the drive device.

FIG. 8 shows a structure of a drive device 200 according to a modified example and a power conversion device 210 including the drive device 200. The power conversion device 210 includes a switching circuit 10 and a drive device 200. Here, the switching circuit 10 has a similar structure to that in the above-described power conversion device 110.

The drive device 200 has a gate driving unit 20 and a bootstrap circuit 140. Here, the gate driving unit 20 has a similar structure to that of the above-described drive device 100. However, the resistance elements 35, 36 within the level shifting circuit 30 are not required.

The bootstrap circuit 140 includes the positive-side and negative-side power sources VCCH, VCCL, the positive-side and negative-side capacitors 41, 42, the rectifiers 43, 44, the resistance elements 45, 46, the switching element 47, the rectifying element 48 and the timing detecting circuit 150 with a configuration in which the resistance element 45 is inserted between the positive-side power source VCCH in the above-described bootstrap circuit 40 and the rectifier 43, the resistance element 46 is inserted between the negative-side power source VCCL and the rectifier 44, and the timing detecting circuit 50 is replaced with the timing detecting circuit 150. In the bootstrap circuit 140, the potential state on the high side is detected by utilizing the potential BSV of the connection point between the rectifier 43 and the resistance element 45, and the potential state on the high side is input to the timing detecting circuit 150.

Figure 9:
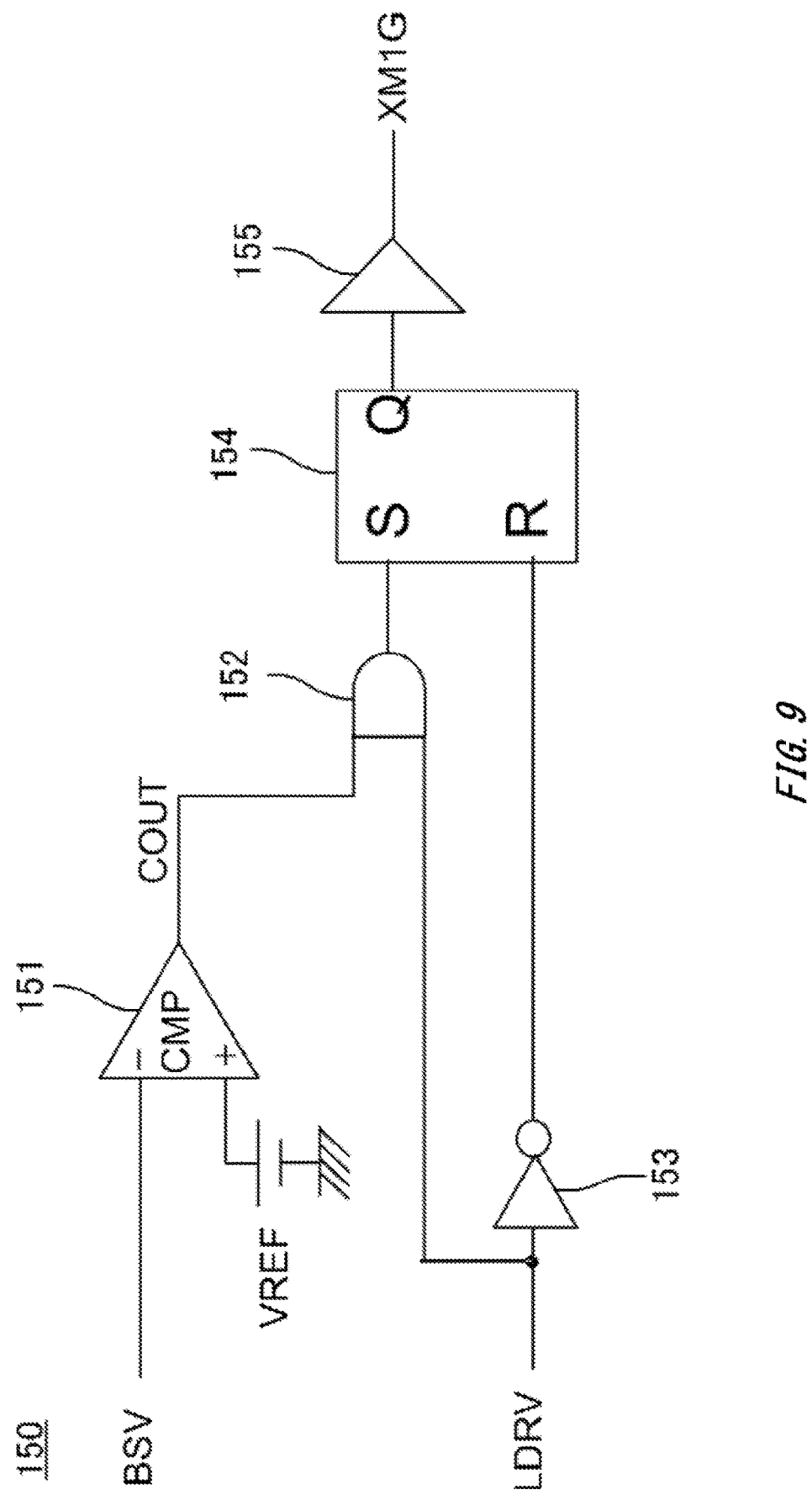
FIG. 9 shows a structure of a timing detecting circuit according to a modified example.

FIG. 9 shows a structure of the timing detecting circuit 150. The timing detecting circuit 150 has a comparator 151, a logical product (AND) circuit 152, a logical negation (NOT) circuit 153, a latch circuit 154 and an amplifier 155.

The comparator 151 compares the potential BSV to the reference VREF, and when the potential BSV is equal to or lower than the reference VREF and when the potential BSV is higher than the reference VREF, the comparator 151 respectively outputs a high-level comparison result COUT and a low-level comparison result COUT. Accordingly, under a condition that the potential BSV is equal to or lower than the reference voltage corresponding to the reference VREF, that is, that an amount of current flowing from the positive-side power source VCCH toward the positive-side capacitor 41 is equal to or greater than a threshold current amount corresponding to the reference VREF, the charging timing can be detected.

The AND circuit 152 calculates AND of the comparison result COUT of the comparator 151 and the gate control signal LDRV and outputs a result. Accordingly, when the comparison result COUT of the comparator 51 is in high level, that is, when the switching element 11 is turned off and the gate driving circuit 21 provided on the high side is in the low potential state, the pulse signal is output.

The NOT circuit 153 calculates NOT of the gate control signal LDRV and outputs a result.

The latch circuit 154 is set by the output of the AND circuit 152 and is reset by NOT of the gate control signal LDRV. Accordingly, when the switching element 11 is turned off and the gate driving circuit 21 provided on the high side is in the low potential state, the charging starts in synchronization with the turning on of the switching element 12, and the charging timing signal for ending the charging in synchronization with the turning off of the switching element 12 is generated.

The amplifier 155 amplifies and outputs an output of the latch circuit 154. The output is input to the gate of the switching element 47 as the gate driving signal XM1G.

Note that the gate control signal LDRV may also be delayed via a delay circuit and be input to the AND circuit 152, and NOT of the gate control signal LDRV may also be delayed via the delay circuit and be input to the latch circuit 154.

Figure 10:
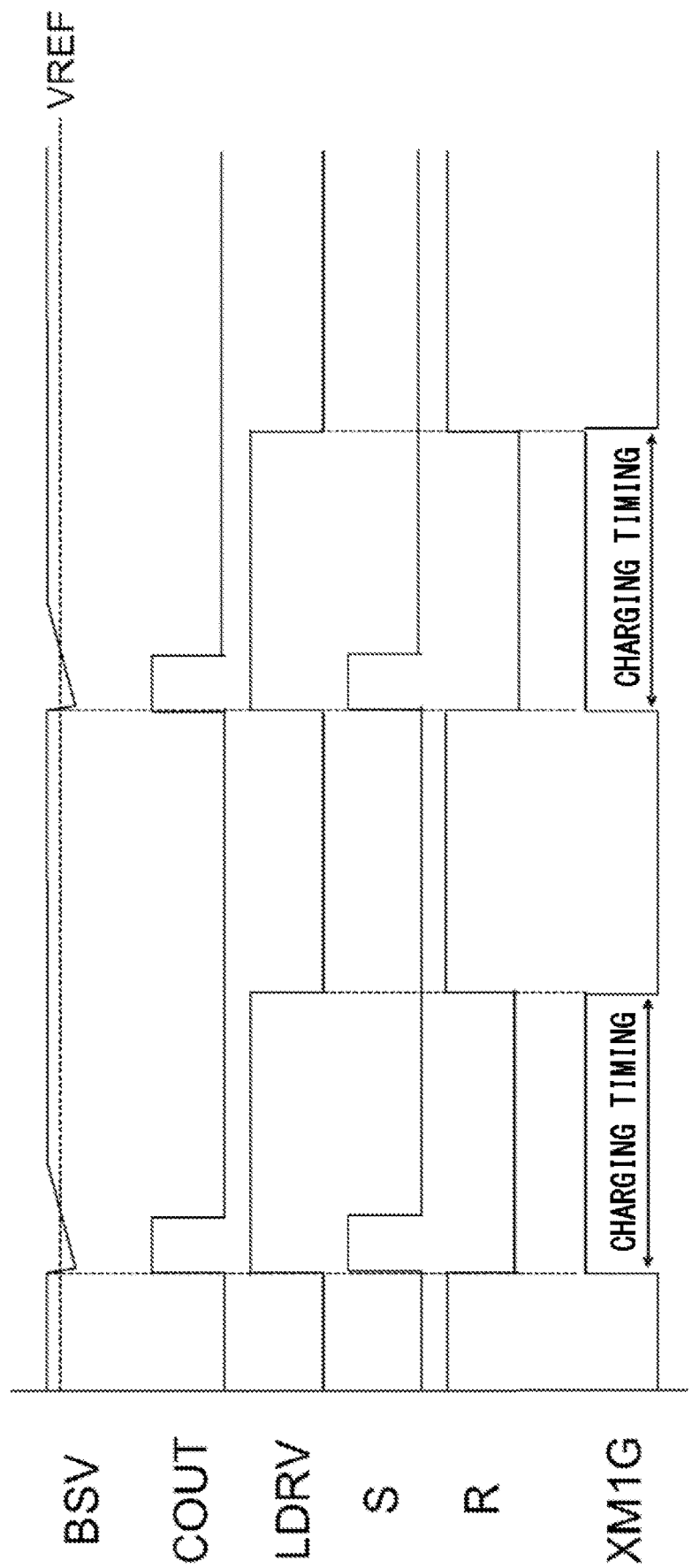
FIG. 10 shows one example of an operating waveform of the timing detecting circuit according to the modified example.

FIG. 10 shows one example of the operating waveform of the timing detecting circuit 150 according to the modified example. The top row shows a waveform of the potential BSV. The potential BSV indicates a potential state of the high side, and falls in association with the turning on of the switching element 12 and rises in association with the charging of the positive-side capacitor 41. The second row shows a waveform of the output COUT of the comparator 51. When the potential BSV is equal to or lower than the reference VREF and when the potential BSV is higher than the potential BSV, the output COUT is respectively in high level and in low level. The third row shows a waveform of the gate control signal LDRV on the low side. Contrary to the gate control signal HDRV on the high side (not shown in the drawings), the gate control signal LDRV is repeated in high level and low level. The fourth and fifth rows respectively show a waveform of the output S of the AND circuit 152 and a waveform of the output R of the NOT circuit 153. When the output COUT of the comparator 151 is in high level, that is, when the switching element 11 is turned off and the gate driving circuit 21 provided on the high side is in the low potential state, the output S rises in accordance with the rising of the gate control signal LDRV (corresponding to the turning on of the switching element 12) and falls in accordance with the falling of the output COUT or the falling of the gate control signal LDRV. The output R rises in accordance with the falling of the gate control signal LDRV (corresponding to the turning off of the switching element 12) and falls in accordance with the rising of the gate control signal LDRV (corresponding to the turning on of the switching element 12). The sixth row shows a waveform of the gate driving signal XM1G The gate driving signal XM1G rises in accordance with the rising of the output S and falls in accordance with the rising of the output R. Accordingly, the charging timing of the negative-side capacitor 42 starts at the timing of the turning on of the switching element 12 when the gate driving circuit 21 provided on the high side is in the low potential state, and ends at the timing of the turning off of the switching element 12.

Note that in the drive device 100 according to the present embodiment and in the drive device 200 according to the modified example, the positive-side and negative-side power sources VCCH, VCCL are provided on the low side and the positive-side and negative-side capacitors 41, 42 are provided on the high side; however, instead of this, the positive-side and negative-side power sources VCCH, VCCL may also be provided on the high side and the positive-side and negative-side capacitors 41, 42 may also be provided on the low side. In this case, the input circuit 23, the filter delay circuit 24 and the pulse generating circuit 25 are provided on the high side, and the level shifting circuit 30 generates the converted gate control signal for controlling the gate of the switching element 12 by shifting the level of the gate control signal LDRV (the control signals SET, RES to be generated therefrom) using the reference potential VS as the reference and converting to a signal using the reference potential COM as the reference.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by a device, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

9 . . . microprocessor; 10 . . . switching circuit; 11, 12 . . . switching element; 13, 14 . . . rectifying element; 20 . . . gate driving unit; 21, 22 . . . gate driving circuit; 23 . . . input circuit; 24 . . . filter delay circuit; 25 . . . pulse generating circuit; 26, 27 . . . Zener diode; 30 . . . level shifting circuit; 31R, 31S . . . resistance element; 32R, 32S . . . switching element; 33R, 33S, 34R, 34S . . . rectifying element; 35, 36 . . . resistance element; 40 . . . bootstrap circuit; 41 . . . positive-side capacitor; 42 . . . negative-side capacitor; 43, 44 . . . rectifier; 45, 46 . . . resistance element; 47 . . . switching element; 48 . . . rectifying element; 50 . . . timing detecting circuit; 51 . . . comparator; 52 . . . Zener diode; 53 . . . delay circuit; 54 . . . AND circuit; 55 . . . NOT circuit; 56 . . . delay circuit; 57 . . . latch circuit; 58 . . . amplifier; 100 . . . drive device; 110 . . . power conversion device; 140 . . . bootstrap circuit; 150 . . . timing detecting circuit; 151 . . . comparator; 152 . . . AND circuit; 153 . . . NOT circuit; 154 . . . latch circuit; 155 . . . amplifier; 200 . . . drive device; 210 . . . power conversion device

What is claimed is:

1. A drive device that drives a switching circuit having a first switching element and a second switching element that are connected to each other in series, the drive device comprising:
a gate driving unit that has a first gate driving circuit that drives a gate of the first switching element, and a second gate driving circuit that drives a gate of the second switching element;
a negative-side power source that supplies a first negative potential to the gate driving unit, wherein a first reference potential that is a potential on a low side of the first switching element is a positive-side potential of the negative-side power source and the first negative potential is a negative-side potential of the negative-side power source;
a negative-side capacitor for supplying a second negative potential to the gate driving unit, wherein a second reference potential that is a potential on a high side of the first switching element is a positive-side potential of the negative-side capacitor and the second negative potential is a negative-side potential of the negative-side capacitor;
a timing detecting circuit that detects, based on a potential state of a driving circuit on a high side that is one of the first gate driving circuit and the second gate driving circuit, charging timing at which the negative-side capacitor is to be charged; and
a charging circuit that charges the negative-side capacitor by using the negative-side power source at the charging timing, wherein
the timing detecting circuit detects the charging timing under a condition that a difference between the second reference potential and the first negative potential is equal to or lower than a reference voltage.

2. The drive device according to claim 1, comprising:
a positive-side power source that supplies a first positive potential to the gate driving unit, wherein the first reference potential is a negative-side potential of the positive-side power source and the first positive potential is a positive-side potential of the positive-side power source;
a positive-side capacitor for supplying a second positive potential to the gate driving unit, wherein the second reference potential is a negative-side potential of the positive-side capacitor and the second positive potential is a positive-side potential of the positive-side capacitor; and
a first rectifier that passes current therethrough, the current being from a positive-side terminal of the positive-side power source toward the positive-side capacitor, and blocks current in an opposite direction.

3. The drive device according to claim 1, wherein
the timing detecting circuit detects the charging timing under a condition that a divided voltage obtained by dividing the second reference potential and the first negative potential is equal to or lower than a first threshold.

4. The drive device according to claim 3, wherein the timing detecting circuit clamps the divided voltage to a voltage equal to or lower than a second threshold that is higher than the first threshold.

5. The drive device according to claim 1, wherein the timing detecting circuit detects the charging timing under a further condition that a first gate control signal is received, wherein the first gate control signal instructs the first gate driving circuit to turn on the first switching element.

6. The drive device according to claim 1, wherein the charging circuit has a third switching element that connects the first negative potential and the second negative potential at the charging timing.

7. The drive device according to claim 1, further comprising:
a second rectifier that passes current therethrough, the current being from the first reference potential toward the second reference potential, and blocks current in an opposite direction.

8. The drive device according to claim 1, wherein the first switching element is a switching element on a low side of the switching circuit, and
the second switching element is a switching element on a high side of the switching circuit.

9. The drive device according to claim 8, wherein the first gate driving circuit receives the first positive potential and the first negative potential as a driving voltage, and
the second gate driving circuit receives the second positive potential and the second negative potential as a driving voltage.

10. The drive device according to claim 8, further comprising:
a level shifting circuit that shifts a level of a first gate control signal, the first gate control signal being for controlling a gate of the second switching element and using the first reference potential as a reference, to generate a second converted gate control signal that uses the second reference potential as a reference, wherein
the second gate driving circuit drives a gate of the second switching element according to the second converted gate control signal.

11. The drive device according to claim 10, wherein the level shifting circuit has:
a level shifting resistor and a level-shifting switching element that are connected to each other in series in this sequence between the second positive potential and the second negative potential; and
a level shifting rectifier that passes current therethrough, the current being from the second reference potential toward a connection point between the level shifting resistor and the level-shifting switching element, and blocks current in an opposite direction.

12. A power conversion device comprising
the drive device according to claim 1; and
the first switching element and the second switching element.

13. A drive device that drives a switching circuit having a first switching element and a second switching element that are connected to each other in series, the drive device comprising:

a gate driving unit that has a first gate driving circuit that drives a gate of the first switching element, and a second gate driving circuit that drives a gate of the second switching element;
a negative-side power source that supplies a first negative potential to the gate driving unit, wherein a first reference potential that is a potential on a low side of the first switching element is a positive-side potential of the negative-side power source and the first negative potential is a negative-side potential of the negative-side power source;
a negative-side capacitor for supplying a second negative potential to the gate driving unit, wherein a second reference potential that is a potential on a high side of the first switching element is a positive-side potential of the negative-side capacitor and the second negative potential is a negative-side potential of the negative-side capacitor;
a timing detecting circuit that detects, based on a potential state of a driving circuit on a high side that is one of the first gate driving circuit and the second gate driving circuit, charging timing at which the negative-side capacitor is to be charged;
a charging circuit that charges the negative-side capacitor by using the negative-side power source at the charging timing;
a positive-side power source that supplies a first positive potential to the gate driving unit, wherein the first reference potential is a negative-side potential of the positive-side power source and the first positive potential is a positive-side potential of the positive-side power source;
a positive-side capacitor for supplying a second positive potential to the gate driving unit, wherein the second reference potential is a negative-side potential of the positive-side capacitor and the second positive potential is a positive-side potential of the positive-side capacitor; and
a first rectifier that passes current therethrough, the current being from a positive-side terminal of the positive-side power source toward the positive-side capacitor, and blocks current in an opposite direction, wherein
the timing detecting circuit detects the charging timing under a condition that the current flowing from the positive-side power source toward the positive-side capacitor is equal to or greater than a third threshold.

14. The drive device according to claim 13, wherein the negative-side capacitor has smaller capacitance than that of the positive-side capacitor.

15. A drive device that drives a switching circuit having a first switching element and a second switching element that are connected to each other in series, the drive device comprising:
a gate driving unit that has a first gate driving circuit that drives a gate of the first switching element, and a second gate driving circuit that drives a gate of the second switching element;
a negative-side power source that supplies a first negative potential to the gate driving unit, wherein a first reference potential that is a potential on a low side of the first switching element is a positive-side potential of the negative-side power source and the first negative potential is a negative-side potential of the negative-side power source;
a negative-side capacitor for supplying a second negative potential to the gate driving unit, wherein a second reference potential that is a potential on a high side of the first switching element is a positive-side potential of the negative-side capacitor and the second negative potential is a negative-side potential of the negative-side capacitor;

a timing detecting circuit, to which the first negative potential is directly input, and that detects, based on a potential state of a driving circuit on a high side that is one of the first gate driving circuit and the second gate driving circuit, charging timing at which the negative-side capacitor is to be charged; and a charging circuit that charges the negative-side capacitor by using the negative-side power source at the charging timing, wherein the charging circuit has a third switching element that connects the first negative potential and the second negative potential at the charging timing, the timing detecting circuit outputs a driving signal that indicates the charging timing using the first negative potential as a reference, and the third switching element connects the first negative potential and the second negative potential based on the driving signal.

16. The drive device according to claim 15, wherein the timing detecting circuit detects the charging timing based on at least one of the first positive potential, the second positive potential, the first reference potential, the second reference potential, the first negative potential and the second negative potential.

* * * * *